United States Patent
Park et al.

(10) Patent No.: US 11,355,689 B2
(45) Date of Patent: Jun. 7, 2022

(54) THERMOELECTRIC MODULE

(71) Applicant: LG INNOTEK CO., LTD., Seoul (KR)

(72) Inventors: Jin Gyeong Park, Seoul (KR); Jeung Ook Park, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/287,654

(22) PCT Filed: Oct. 23, 2019

(86) PCT No.: PCT/KR2019/013923
§ 371 (c)(1),
(2) Date: Apr. 22, 2021

(87) PCT Pub. No.: WO2020/096228
PCT Pub. Date: May 14, 2020

(65) Prior Publication Data
US 2021/0384399 A1    Dec. 9, 2021

(30) Foreign Application Priority Data
Nov. 8, 2018 (KR) .......................... 10-2018-0136794

(51) Int. Cl.
*H01L 35/32* (2006.01)
*H01L 35/08* (2006.01)
(Continued)

(52) U.S. Cl.
CPC ............. *H01L 35/32* (2013.01); *H01L 35/08* (2013.01); *H01L 35/10* (2013.01); *H01L 35/16* (2013.01)

(58) Field of Classification Search
CPC ......... H01L 35/08; H01L 35/10; H01L 35/16; H01L 35/32
See application file for complete search history.

(56) References Cited

U.S. PATENT DOCUMENTS 7,503,180 B2 *   3/2009   Morimoto ............... H01L 35/32
                                                    136/204
9,947,854 B2 *   4/2018   Cho ....................... H01L 35/325
(Continued)

FOREIGN PATENT DOCUMENTS

JP       05-183195       7/1993
JP      2000-349353     12/2000
(Continued)

OTHER PUBLICATIONS

International Search Report dated Jan. 31, 2020 issued in Application No. PCT/KR2019/013923.

*Primary Examiner* — Golam Mowla
(74) *Attorney, Agent, or Firm* — Ked & Associates, LLP

(57) ABSTRACT

A thermoelectric module according to one embodiment of the present invention comprises: a first substrate; a thermoelectric element disposed on the first substrate; a second substrate disposed on the thermoelectric element and having a smaller area than the first substrate; a sealing part disposed on the first substrate and surrounding a side surface of the thermoelectric element; and a wire part connected to the thermoelectric element, drawn out through the sealing part, and supplying power to the thermoelectric element, wherein the sealing part has a through hole through which the wire part passes, and the through hole is disposed closer to the second substrate than the first substrate.

18 Claims, 12 Drawing Sheets

100; 110, 120, 130, 140, 150, 160
300; 310, 320

(51) Int. Cl.
*H01L 35/10* (2006.01)
*H01L 35/16* (2006.01)

(56) References Cited

U.S. PATENT DOCUMENTS

| | | | | |
|---|---|---|---|---|
| 2003/0193087 A1* | 10/2003 | Hayashi | ............... | H01L 35/32 257/712 |
| 2009/0084421 A1* | 4/2009 | Olsen | ............... | H01L 35/32 204/192.12 |
| 2010/0252084 A1* | 10/2010 | Konishi | ............... | H01L 35/32 136/200 |
| 2014/0190543 A1* | 7/2014 | Chen | ............... | H01L 27/16 136/224 |
| 2015/0194589 A1* | 7/2015 | Roh | ............... | H01L 35/32 136/205 |
| 2016/0204329 A1* | 7/2016 | Cho | ............... | H01L 35/30 136/212 |
| 2017/0279026 A1 | 9/2017 | Himmer et al. | | |

FOREIGN PATENT DOCUMENTS

| | | |
|---|---|---|
| JP | 2007-035974 | 2/2007 |
| JP | 2013-191801 | 9/2013 |

* cited by examiner

300; 310, 312, 320, 322, 340, 342

THERMOELECTRIC MODULE

CROSS-REFERENCE TO RELATED PATENT APPLICATIONS

This application is a U.S. National Stage Application under 35 U.S.C. § 371 of PCT Application No. PCT/KR2019/013923, filed Oct. 23, 2019, which claims priority to Korean Patent Application No. 10-2018-0136794, filed Nov. 8, 2018, whose entire disclosures are hereby incorporated by reference.

TECHNICAL FIELD

The present invention relates to a thermoelectric module, and more specifically, to a wire connection structure included in a thermoelectric module.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like.

The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, wherein a plurality of thermoelectric legs are disposed in an array form between an upper substrate and a lower substrate, a plurality of upper electrodes are disposed between the plurality of thermoelectric legs and the upper substrate, and a plurality of lower electrodes are disposed between the plurality of thermoelectric legs and the lower substrate.

In this case, wires are connected to the electrodes, and power is supplied to the thermoelectric element through the wires.

To this end, it is necessary to solder between the electrodes and the wires, and when the substrate is a metal substrate, it is necessary to heat the substrate for soldering. When the thermoelectric element is applied to a home appliance, for example, a deep-temperature refrigeration apparatus or a water purifier, a soldering iron setting temperature is set to approximately 450° C., and after heating the thermoelectric element to approximately 70° C., the thermoelectric element should have a stabilization time of approximately 120 seconds. When the thermoelectric element is applied to a vehicle, for example, a rider or a ventilation seat, the soldering iron setting temperature is set to approximately 450° C., and after heating the thermoelectric element to approximately 145° C., the thermoelectric element should have a stabilization time of approximately 60 seconds. Like the above, the thermoelectric element can be exposed to a high temperature during a soldering process between the electrodes and the wires, and accordingly, the thermoelectric leg or the thermoelectric element can be damaged by the high temperature.

Further, in a process of connecting the wires to the electrodes and then sealing the thermoelectric element, since a process of sealing between the electrodes, the wires, and a sealing case can only be manually performed, there is a problem in that time and costs required for the sealing process are large.

DISCLOSURE

Technical Problem

The present invention is directed to providing a wire connection structure of a thermoelectric module.

Technical Solution

One aspect of the present invention provides a thermoelectric module including: a first substrate; a thermoelectric element disposed on the first substrate; a second substrate disposed on the thermoelectric element and having a smaller area than the first substrate; a sealing part disposed on the first substrate and surrounding a side surface of the thermoelectric element; and a wire part connected to the thermoelectric element, drawn out through the sealing part, and supplying power to the thermoelectric element, wherein the sealing part has a through hole through which the wire part passes, and the through hole is disposed closer to the second substrate than the first substrate.

The thermoelectric element may include a first resin layer disposed on the first substrate, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second resin layer disposed on the plurality of second electrodes, and the wire part may include a first wire connected to one electrode among the plurality of first electrodes and a second wire connected to another electrode among the plurality of first electrodes.

The wire part may further include a first connector configured to connect the one electrode and the first wire and a second connector configured to connect the other electrode and the second wire.

At least one of the first connector and the second connector may include an electrode connection region coming into contact with at least one of the one electrode and the other electrode and having electrical conductivity, an inclined region forming a predetermined inclination angle with at least one of the one electrode and the other electrode, and a wire fastening region to which at least one of the first wire and the second wire is fastened.

The wire part may further include a first support disposed between the one electrode and the first connector and a second support disposed between the other electrode and the second connector, and at least one of an angle formed by the first wire and the one electrode and an angle formed by the second wire and the other electrode may be changed by at least one of the first support and the second support.

At least one of the first support and the second support may have electrical conductivity and come into contact with at least one of the one electrode and the other electrode, at least one of the first connector and the second connector may include a surface having electrical conductivity, and the surface having electrical conductivity may come into contact with at least one of the first support and the second support.

At least one of the first wire and the second wire may be connected to at least one of the first connector and the second connector in a direction from the second substrate to the first substrate.

The one electrode and the other electrode may be disposed adjacent to each other, and the thermoelectric module may further include a connector configured to connect the one electrode and the first wire and connect the other electrode and the second wire.

Another aspect of the present invention provides a thermoelectric module including: a first substrate; a thermoelectric element disposed on the first substrate; a second substrate disposed on the thermoelectric element; a sealing part surrounding a side surface of the thermoelectric element; and a wire part connected to the thermoelectric element, drawn out through the sealing part, and supplying power to the thermoelectric element, wherein the thermoelectric element includes a first resin layer disposed on the first substrate, a first electrode disposed on the first resin layer, a P-type thermoelectric leg and an N-type thermoelectric leg disposed on the first electrode, a second electrode disposed on the P-type thermoelectric leg and the N-type thermoelectric leg, and a second resin layer disposed on the second electrode, and at least a partial region of the wire part is disposed to form an angle of 10 to 90° with respect to the first electrode.

The wire part may include a first region connected to the first electrode and disposed at an inner side of the sealing part, a second region disposed at an outer side of the sealing part, and a third region disposed between the first region and the second region, and the at least partial region of the wire part may be included in the third region.

The at least partial region of the wire part may be disposed to form an angle of 30 to 70° with respect to the first electrode.

Advantageous Effects

According to an embodiment of the present invention, a thermoelectric module having excellent thermal conductivity and high reliability can be obtained. Specifically, according to the embodiment of the present invention, a thermoelectric module in which wire connection is easy, a tensile force of a wire is strong not only in a horizontal direction but also in a vertical direction of an electrode, and replacing the wire is easy when a defect occurs in the wire can be obtained. Further, according to the embodiment of the present invention, it is possible to obtain a thermoelectric module in which a sealing process is easy.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

Further, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

Figure 1:
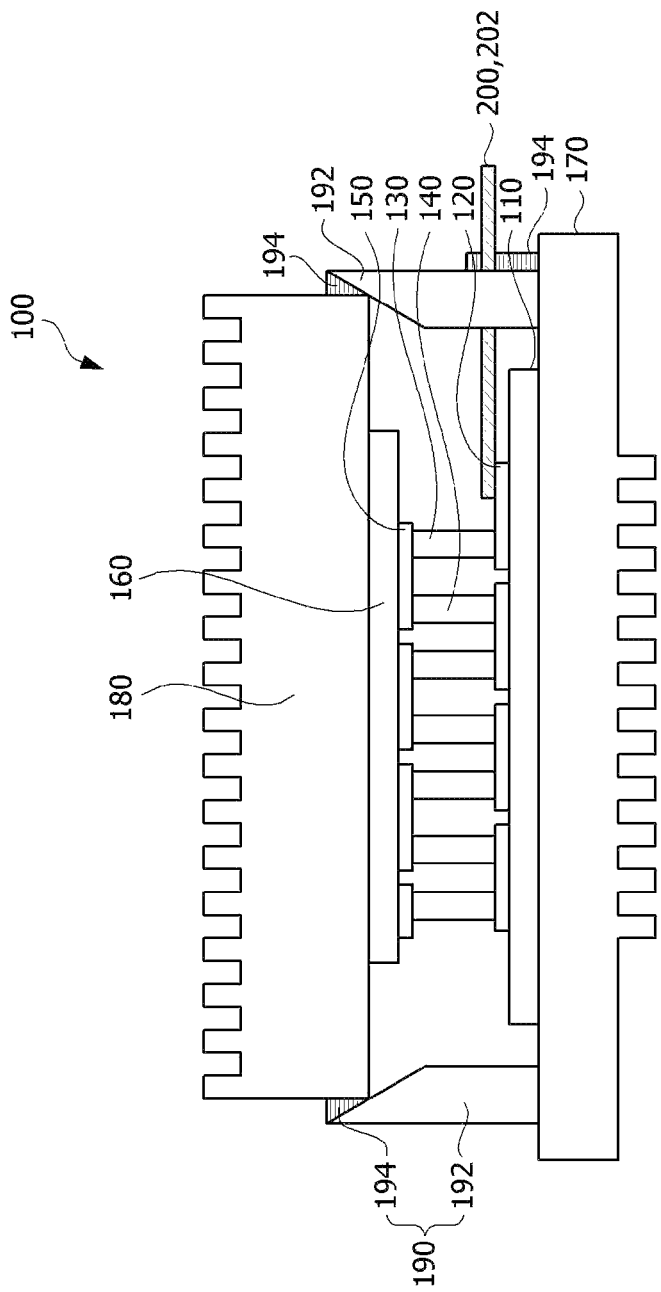
FIG. 1 is a cross-sectional view of a thermoelectric module.
Figure 2B:
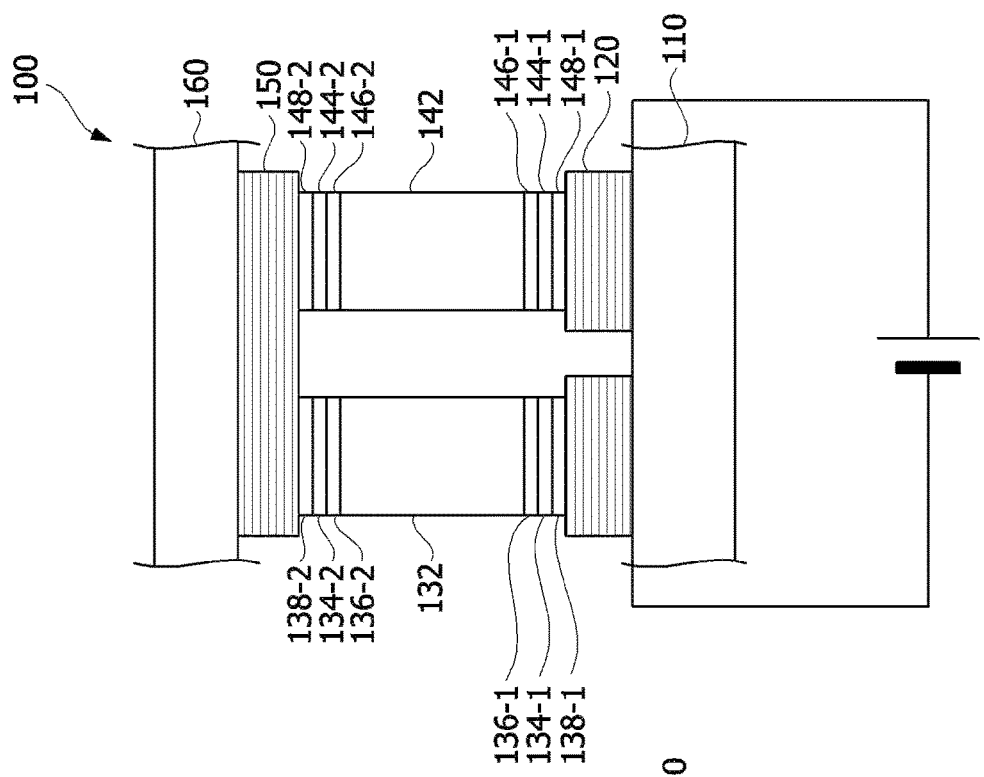
FIGS. 2A and 2B are cross-sectional views of a thermoelectric element included in FIG. 1.
Figure 2A:
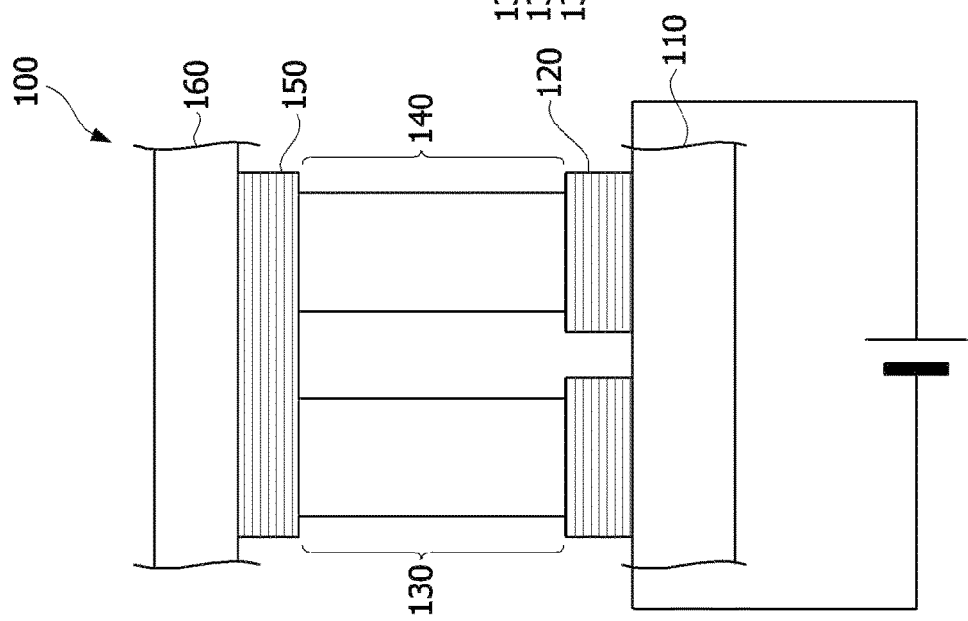
Figure 3:
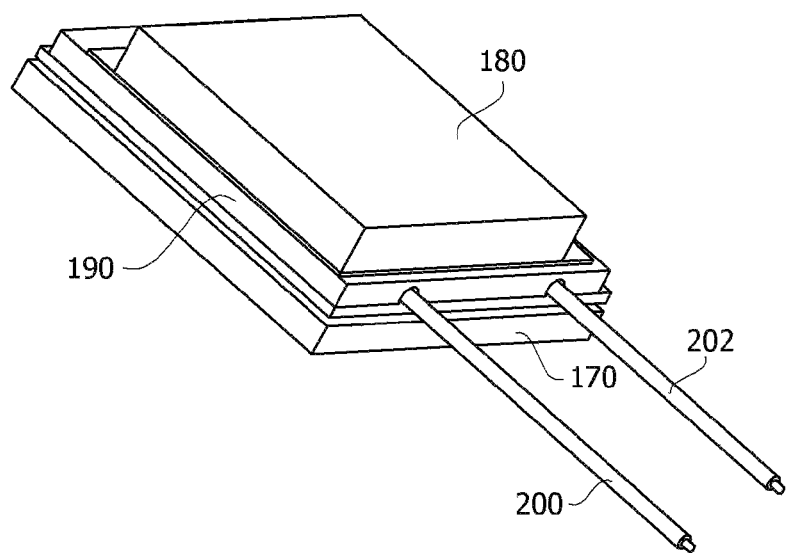
FIG. 3 is a perspective of the thermoelectric module in FIG. 1.
Figure 4:
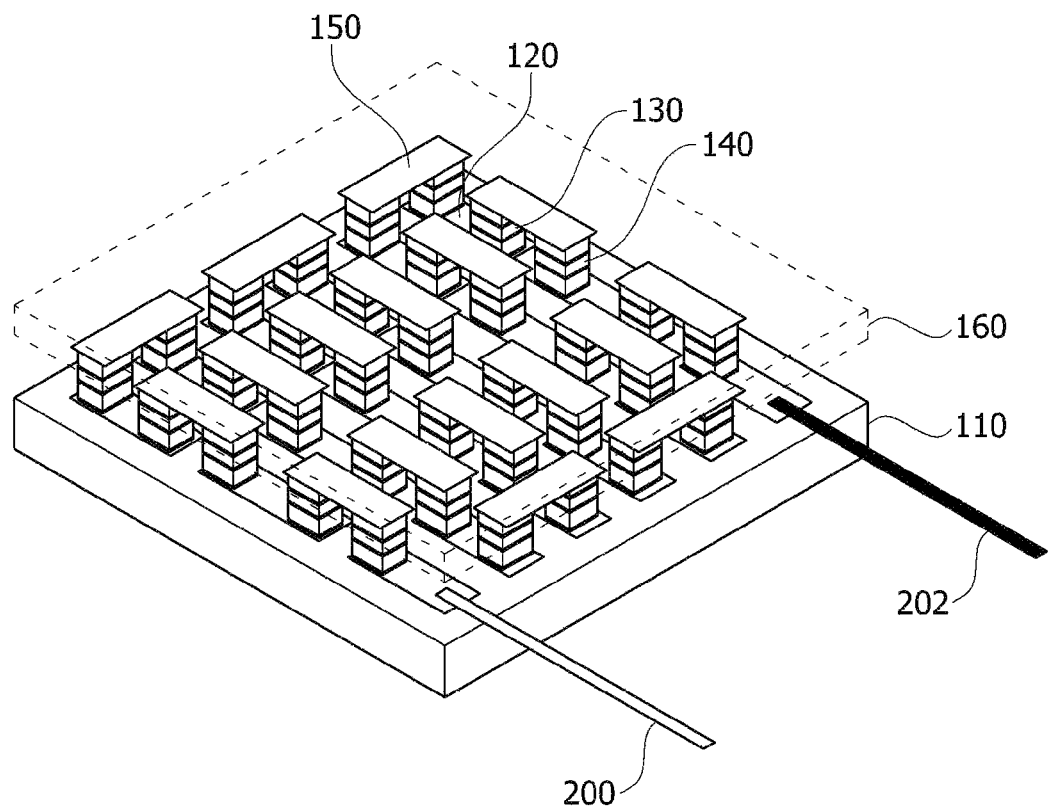
FIG. 4 is a view illustrating an electrode connection method of the thermoelectric module in FIG. 1.

FIG. 1 is a cross-sectional view of a thermoelectric module, FIG. 2 is a cross-sectional view of a thermoelectric element included in FIG. 1, FIG. 3 is a perspective of the thermoelectric module in FIG. 1, and FIG. 4 is a view illustrating an electrode connection method of the thermoelectric module in FIG. 1.

Referring to FIGS. 1 to 4, a thermoelectric element 100 includes a first resin layer 110, a plurality of first electrodes 120, a plurality of P-type thermoelectric legs 130, a plurality of N-type thermoelectric legs 140, a plurality of second electrodes 150, and a second resin layer 160.

The plurality of first electrodes 120 are disposed between the first resin layer 110 and lower surfaces of the plurality of P-type thermoelectric legs 130 and the plurality of N-type thermoelectric legs 140, and the plurality of second electrodes 150 are disposed between the second resin layer 160 and upper surfaces of the plurality of P-type thermoelectric legs 130 and the plurality of N-type thermoelectric legs 140. Accordingly, the plurality of P-type thermoelectric legs 130 and the plurality of N-type thermoelectric legs 140 are electrically connected by the plurality of first electrodes 120 and the plurality of second electrodes 150. One pair of the P-type thermoelectric leg 130 and the N-type thermoelectric leg 140 which are disposed between the first electrode 120 and the second electrode 150 and electrically connected to each other may form a unit cell.

One pair of the P-type thermoelectric leg 130 and the N-type thermoelectric leg 140 may be disposed on each first electrode 120, and one pair of the P-type thermoelectric leg 130 and the N-type thermoelectric leg 140 may be disposed on each second electrode 150 so that one of one pair of the P-type thermoelectric leg 130 and the N-type thermoelectric leg 140 disposed on each first electrode 120 overlaps the second electrode 150.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a thermoelectric leg including a bismuth-telluride (Bi—Te)-based main raw material in an amount of 99 to 99.999 wt % including at least one among antimony (Sb), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Se—Te, and Bi or Te may be further included in an amount of 0.001 to 1 wt % of the total weight. The N-type thermoelectric leg 140 may be a thermoelectric leg including a bismuth-telluride (Bi—Te)-based main raw material in an amount of 99 to 99.999 wt % including at least one among selenium (Se), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Sb—Te, and Bi or Te may be further included in an amount of 0.001 to 1 wt % of the total weight.

The P-type thermoelectric legs 130 and the N-type thermoelectric legs 140 may be formed in a bulk type or a stacked type. Generally, the bulk type P-type thermoelectric legs 130 or the bulk type N-type thermoelectric legs 140 may be obtained through a process of producing an ingot by heat-treating a thermoelectric material, pulverizing and sieving the ingot to obtain powder for thermoelectric legs, sintering the powder, and cutting the sintered object. The stacked type P-type thermoelectric legs 130 or the stacked type N-type thermoelectric legs 140 may be obtained through a process of forming a unit member by applying a paste including a thermoelectric material on a sheet-shaped base material and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

The performance of the thermoelectric element according to one embodiment of the present invention may be expressed as the Seebeck index. The Seebeck index (ZT) may be expressed as in Equation 1.

$$ZT = \alpha^2 \cdot \sigma \cdot T / k \qquad \text{[Equation 1]}$$

Here, $\alpha$ is the Seebeck coefficient [V/K], $\sigma$ is electrical conductivity [S/m], and $\alpha 2\sigma$ is a power factor (W/mK2]). Further, T is a temperature, and k is thermal conductivity [W/mK]. k may be expressed as $a \cdot cp \cdot \rho$, wherein a is thermal diffusivity [cm2/S], cp is specific heat [J/gK], and $\rho$ is density [g/cm3].

In order to obtain the Seebeck index of the thermoelectric element, a Z value (V/K) is measured using a Z meter, and the Seebeck index (ZT) may be calculated using the measured Z value.

According to another embodiment of the present invention, the P-type thermoelectric legs 130 and the N-type thermoelectric legs 140 may have a structure shown in FIG. 2B. Referring to FIG. 2B, the thermoelectric legs 130 and 140 include thermoelectric material layers 132 and 142, first plated layers 134-1 and 144-1 stacked on one surfaces of the thermoelectric material layers 132 and 142, second plated layers 134-2 and 144-2 stacked on the other surfaces disposed opposite the one surfaces of the thermoelectric material layers 132 and 142, first bonding layers 136-1 and 146-1 and second bonding layers 136-2 and 146-2 respectively disposed between the thermoelectric material layers 132 and 142 and the first plated layers 134-1 and 144-1 and between the thermoelectric material layers 132 and 142 and the second plated layers 134-2 and 144-2, and first metal layers 138-1 and 148-1 and second metal layers 138-2 and 148-2 respectively stacked on the first plated layers 134-1 and 144-1 and the second plated layers 134-2 and 144-2.

In this case, the thermoelectric material layers 132 and 142 and the first bonding layers 136-1 and 146-1 may come into direct contact with each other, and the thermoelectric material layers 132 and 142 and the second bonding layers 136-2 and 146-2 may come into direct contact with each other. Further, the first bonding layers 136-1 and 146-1 and the first plated layers 134-1 and 144-1 may come into direct contact with each other, and the second bonding layers 136-2 and 146-2 and the second plated layers 134-2 and 144-2 may come into direct contact with each other. In addition, the first plated layers 134-1 and 144-1 and the first metal layers 138-1 and 148-1 may come into direct contact with each other, and the second plated layers 134-2 and 144-2 and the second metal layers 138-2 and 148-2 may come into direct contact with each other.

Here, the thermoelectric material layers 132 and 142 may include bismuth (Bi) and tellurium (Te), which are semiconductor materials. The thermoelectric material layers 132 and 142 may have the same material or shape as the P-type thermoelectric legs 130 or the N-type thermoelectric legs 140 shown in FIGS. 1 and 2A.

Further, the first metal layers 138-1 and 148-1 and the second metal layers 138-2 and 148-2 may be selected from copper (Cu), a copper alloy, aluminum (Al) and an aluminum alloy and may each have a thickness of 0.1 to 0.5 mm, and preferably, 0.2 to 0.3 mm. Since coefficients of thermal expansion of the first metal layers 138-1 and 148-1 and the second metal layers 138-2 and 148-2 are similar to or greater than those of the thermoelectric material layers 132 and 142, compressive stress is applied at interfaces between the first metal layers 138-1 and 148-1 and the second metal layers 138-2 and 148-2, and the thermoelectric material layers 132 and 142 during sintering, and thus cracks or peeling may be prevented. Further, since a bonding force between the first metal layers 138-1 and 148-1 and the second metal layers 138-2, and 148-2, and the electrodes 120 and 150 is high, the thermoelectric legs 130 and 140 may be stably coupled to the electrodes 120 and 150.

Next, the first plated layers 134-1 and 144-1 and the second plated layers 134-2 and 144-2 may each include at least one of Ni, Sn, Ti, Fe, Sb, Cr, and Mo, and may have a thickness of 1 to 20 μm, and preferably 1 to 10 μm. Since the first plated layers 134-1 and 144-1 and the second plated layers 134-2 and 144-2 prevent a reaction between Bi or Te which is a semiconductor material in the thermoelectric material layers 132 and 142, and the first metal layers 138-1 and 148-1 and the second metal layers 138-2 and 148-2, performance degradation of the thermoelectric element may be prevented, and oxidation of the first metal layers 138-1 and 148-1 and the second metal layers 138-2 and 148-2 may be prevented.

In this case, the first bonding layers 136-1 and 146-1 and the second bonding layers 136-2 and 146-2 may be respectively disposed between the thermoelectric material layers 132 and 142 and the first plated layers 134-1 and 144-1 and between the thermoelectric material layers 132 and 142 and the second plated layers 134-2 and 144-2. In this case, the first bonding layers 136-1 and 146-1 and the second bonding layers 136-2 and 146-2 may include Te. For example, the first bonding layers 136-1 and 146-1 and the second bonding layers 136-2 and 146-2 may include at least one among Ni—Te, Sn—Te, Ti—Te, Fe—Te, Sb—Te, Cr—Te, and Mo—Te. According to the embodiment of the present invention, the first bonding layers 136-1 and 146-1 and the second bonding layers 136-2 and 146-2 may each have a thickness of 0.5 to 100 μm, and preferably, 1 to 50 μm. According to the embodiment of the present invention, the first bonding layers 136-1 and 146-1 and the second bonding layers 136-2 and 146-2 including Te may be disposed between the thermoelectric material layers 132 and 142, and the first plated layers 134-1 and 144-1 and the second plated layers 134-2 and 144-2 in advance to prevent the diffusion of Te in the thermoelectric material layers 132 and 142 to the first plated layers 134-1 and 144-1 and the second plated layers 134-2 and 144-2. Accordingly, it is possible to prevent the generation of a Bi-rich region.

Accordingly, a Te content is higher than a Bi content from center portions of the thermoelectric material layers 132 and 142 to interfaces between the thermoelectric material layers 132 and 142 and the first bonding layers 136-1 and 146-1, and a Te content is higher than a Bi content from the center portions of the thermoelectric material layers 132 and 142 to interfaces between the thermoelectric material layers 132 and 142 and the second bonding layers 136-2 and 146-2. The Te content from the center portions of the thermoelectric material layers 132 and 142 to the interfaces between the thermoelectric material layers 132 and 142 and the first bonding layers 136-1 and 146-1 or the Te content from the center portions of the thermoelectric material layers 132 and 142 to the interfaces between the thermoelectric material layers 132 and 142 and the second bonding layers 136-2 and 146-2 may be 0.8 to 1 times the Te content in the center portions of the thermoelectric material layers 132 and 142. For example, the Te content within a thickness of 100 μm from the interfaces between the thermoelectric material layers 132 and 142 and the first bonding layers 136-1 and 146-1 in directions toward the center portions of the thermoelectric material layers 132 and 142 may be 0.8 to 1 times the Te content in the center portions of the thermoelectric material layers 132 and 142. Here, the Te content may be uniformly maintained even within the thickness of 100 μm from the interfaces between the thermoelectric material layers 132 and 142 and the first bonding layers 136-1 and 146-1 in the directions toward the center portions of the thermoelectric material layers 132 and 142, and for example, a change rate of a Te weight ratio within the thickness of 100 μm from the interfaces between the thermoelectric material layers 132 and 142 and the first bonding layers 136-1 and 146-1 in the directions toward the center portions of the thermoelectric material layers 132 and 142 may be 0.9 to 1.

Further, a Te content in the first bonding layers 136-1 and 146-1 or the second bonding layers 136-2 and 146-2 may be the same as or similar to a Te content in the thermoelectric material layers 132 and 142. For example, the Te content in the first bonding layers 136-1 and 146-1 or the second bonding layers 136-2 and 146-2 may be 0.8 to 1 times, preferably, 0.85 to 1 times, more preferably, 0.9 to 1 times, and even more preferably, 0.95 to 1 times the Te content in the thermoelectric material layers 132 and 142. Here, the content may be a weight ratio. For example, when the Te content in the thermoelectric material layers 132 and 142 is included in an amount of 50 wt %, the Te content in the first bonding layers 136-1 and 146-1 or the second bonding layers 136-2 and 146-2 may be 40 to 50 wt %, preferably, 42.5 to 50 wt %, more preferably, 45 to 50 wt %, and even more preferably, 47.5 to 50 wt %. Further, the Te content in the first bonding layers 136-1 and 146-1 or the second bonding layers 136-2 and 146-2 may be greater than an Ni content. In the first bonding layers 136-1 and 146-1 or the second bonding layers 136-2 and 146-2, the Te content is uniformly distributed, but the Ni content may decrease while being adjacent in directions toward the thermoelectric material layers 132 and 142 in the first bonding layers 136-1 and 146-1 or the second bonding layers 136-2 and 146-2.

Further, a Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to interfaces between the first plated layers 134-1 and 144-1 and the first bonding layers 136-1 and 146-1 or interfaces between the second plated layers 134-2 and 144-2 and the second bonding layers 136-2 and 146-2 may be uniformly distributed.

For example, a change rate of a Te weight ratio from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plated layers 136-1 and 146-1 and the first bonding layers 136-1 and 146-1 or the interfaces between the second plated layers 134-2 and 144-2 and the second bonding layers 136-2 and 146-2 may be 0.8 to 1. Here, the Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plated layers 136-1 and 146-1 and the first bonding layers 136-1 and 146-1 or the interfaces between the second plated layers 134-2 and 144-2 and the second bonding layers 136-2 and 146-2 may be uniformly distributed as the change rate of the Te weight ratio becomes closer to 1.

Further, the Te content at surfaces in the first bonding layers 136-1 and 146-1 which come into contact with the first plated layers 134-1 and 144-1, that is, the interfaces between the first plated layers 136-1 and 146-1 and the first bonding layers 136-1 and 146-1 or surfaces in the second bonding layers 136-2 and 146-2 which come into contact with the second plated layers 134-2 and 144-2, that is, the interfaces between the second plated layers 134-2 and 144-2 and the second bonding layers 136-2 and 146-2 may be 0.8 to 1 times, preferably, 0.85 to 1 times, more preferably, 0.9 to 1 times, and even more preferably, 0.95 to 1 times the Te content at surfaces in the thermoelectric material layers 132 and 142 which come into contact with the first bonding layers 136-1 and 146-1, that is, the interfaces between the thermoelectric material layers 132 and 142 and the first bonding layers 136-1 and 146-1 or surfaces in the thermoelectric material layers 132 and 142 which come into contact with the second bonding layers 136-2 and 146-2, that is, the interfaces between the thermoelectric material layers 132 and 142 and the second bonding layers 136-2 and 146-2. Here, the content may be a weight ratio.

Further, it can be seen that the Te content in the center portions of the thermoelectric material layers 132 and 142 is the same as or similar to the Te content at the interfaces between the thermoelectric material layers 132 and 142 and the first bonding layers 136-1 and 146-1 or the interfaces between the thermoelectric material layers 132 and 142 and the second bonding layers 136-2 and 146-2. That is, the Te content at the interfaces between the thermoelectric material layers 132 and 142 and the first bonding layers 136-1 and 146-1 or the interfaces between the thermoelectric material layers 132 and 142 and the second bonding layers 136-2 and 146-2 may be 0.8 to 1 times, preferably, 0.85 to 1 times, more preferably, 0.9 to 1 times, and even more preferably, 0.95 to 1 times the Te content at the center portions of the thermoelectric material layers 132 and 142. Here, the content may be a weight ratio. Here, the center portions of the thermoelectric material layers 132 and 142 may refer to surrounding regions including centers of the thermoelectric material layers 132 and 142. Further, the interface may refer to the interface itself or may refer to the interface and surrounding regions of the interface adjacent to the interface within a predetermined distance.

In addition, the Te content in the first plated layers 136-1 and 146-1 or the second plated layers 134-2 and 144-2 may be smaller than the Te content in the thermoelectric material layers 132 and 142 and the Te content in the first bonding layers 136-1 and 146-1 or the second bonding layers 136-2 and 146-2.

In addition, it can be seen that a Bi content in the center portions of the thermoelectric material layers 132 and 142 is the same as or similar to a Bi content at the interfaces between the thermoelectric material layers 132 and 142 and the first bonding layers 136-1 and 146-1 or the interfaces between the thermoelectric material layers 132 and 142 and the second bonding layers 136-2 and 146-2. Accordingly, since the Te content is greater than the Bi content from the center portions of the thermoelectric material layers 132 and 142 to the interfaces between the thermoelectric material layers 132 and 142 and the first bonding layers 136-1 and 146-1 or the interfaces between the thermoelectric material layers 132 and 142 and the second bonding layers 136-2 and 146-2, a section in which the Bi content overtakes the Te content is not present around the interfaces between the thermoelectric material layers 132 and 142 and the first bonding layers 136-1 and 146-1 or the interfaces between the thermoelectric material layers 132 and 142 and the second bonding layers 136-2 and 146-2. For example, the Bi content in the center portions of the thermoelectric material layers 132 and 142 may be 0.8 to 1 times, preferably, 0.85 to 1 times, more preferably, 0.9 to 1 times, and even more preferably, 0.95 to 1 times the Bi content at the interfaces between the thermoelectric material layers 132 and 142 and the first bonding layers 136-1 and 146-1 or the interfaces between the thermoelectric material layers 132 and 142 and the second bonding layers 136-2 and 146-2. Here, the content may be a weight ratio.

Here, the plurality of first electrodes 120 disposed between the first resin layer 110, and the P-type thermoelectric legs 130 and the N-type thermoelectric legs 140, and the plurality of second electrodes 150 disposed between the second resin layer 160, and the P-type thermoelectric legs 130 and the N-type thermoelectric legs 140 may include at least one among copper (Cu), silver (Ag), and nickel (Ni).

Further, the first resin layer 110 and the second resin layer 160 may be formed to have different sizes. For example, a volume, a thickness, or an area of one of the first resin layer 110 and the second resin layer 160 may be formed to be larger than a volume, a thickness, or an area of the other one. Accordingly, it is possible to increase the heat absorption performance or heat dissipation performance of the thermoelectric element.

In this case, the P-type thermoelectric leg 130 or the N-type thermoelectric leg 140 may have a cylindrical shape, a polygonal pillar shape, an oval pillar shape, or the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures in which a semiconductor material is applied on a sheet-shaped base material and then cutting the structures. Accordingly, material loss may be prevented and electrical conduction characteristics may be enhanced.

Alternatively, the P-type thermoelectric leg 130 or the N-type thermoelectric leg 140 may be manufactured according to a zone melting method or a powder sintering method. According to the zone melting method, the thermoelectric leg is obtained through a method of manufacturing an ingot using a thermoelectric material, refining so that particles are rearranged in a single direction by slowly applying heat to the ingot, and slowly cooling the ingot. According to the powder sintering method, the thermoelectric leg is obtained through a process of manufacturing an ingot using a thermoelectric material, pulverizing and sieving the ingot to obtain powder for thermoelectric legs, and sintering the powder.

According to the embodiment of the present invention, the first resin layer 110 may be disposed on a first metal substrate 170, and a second metal substrate 180 may be disposed on the second resin layer 160. The thermoelectric module according to the embodiment of the present invention may include the first metal substrate 170, the thermoelectric element 100, and the second metal substrate 180.

The first metal substrate 170 and the second metal substrate 180 may be formed of aluminum, an aluminum alloy, copper, a copper alloy, or the like. The first metal substrate 170 and the second metal substrate 180 may support the thermoelectric element 100, that is, the first resin layer 110, the plurality of first electrodes 120, the plurality of P-type thermoelectric legs 130, the plurality of N-type thermoelectric legs 140, the plurality of second electrodes 150, the second resin layer 160, and the like, and may be regions that are directly attached to an application to which the thermoelectric element 100 according to the embodiment of the present invention is applied. Accordingly, the first metal substrate 170 and the second metal substrate 180 may be interchanged with a first metal support and a second metal support, respectively.

However, in the specification, the metal substrate is described as an example, but the present invention is not limited thereto. At least one of the first metal substrate 170 and the second metal substrate 180 may be replaced with a ceramic substrate, and accordingly, the first metal substrate 170 and the second metal substrate 180 may be interchanged with a first substrate 170 and a second substrate 180, respectively.

An area of the first metal substrate 170 may be larger than an area of the first resin layer 110, and an area of the second metal substrate 180 may be larger than an area of the second resin layer 160. That is, the first resin layer 110 may be disposed in a region spaced apart from an edge of the first metal substrate 170 by a predetermined distance, and the second resin layer 160 may be disposed in a region spaced apart from an edge of the second metal substrate 180 by a predetermined distance.

The first resin layer 110 and the second resin layer 160 may be formed of a resin composition including a resin and an inorganic filler. Here, the inorganic filler may be included in an amount of 68 to 88 vol % of the resin composition. When the inorganic filler is included in an amount less than 68 vol %, a heat conduction effect may be low, and when the inorganic filler is included in an amount greater than 88 vol %, adhesion between the resin layer and the metal substrate may be lowered, and the resin layer may be easily broken. Here, the resin may be an epoxy resin or a silicone resin. Here, the silicone resin may be polydimethylsiloxane (PDMS).

Thicknesses of the first resin layer 110 and the second resin layer 160 may each be 0.02 to 0.6 mm, preferably, 0.1 to 0.6 mm, and more preferably, 0.2 to 0.6 mm, and thermal conductivity may be 1 W/mK or more, preferably, 10 W/mK or more, and more preferably, 20 W/mK or more.

The epoxy resin may include an epoxy compound and a curing agent. In this case, the curing agent may be included in a volume ratio of 1 to 10 based on a volume ratio of 10 of the epoxy compound. Here, the epoxy compound may include at least one of a crystalline epoxy compound, an amorphous epoxy compound, and a silicone epoxy compound. The crystalline epoxy compound may include a mesogen structure. Mesogen is a basic unit of liquid crystal and includes a rigid structure. Further, the amorphous epoxy compound may be a general amorphous epoxy compound having two or more epoxy groups in a molecule and may be, for example, glycidyl ethers derived from bisphenol A or bisphenol F. Here, the curing agent may include at least one of an amine-based curing agent, a phenolic curing agent, an acid anhydride-based curing agent, a polymercaptan-based curing agent, a polyaminoamide-based curing agent, an isocyanate-based curing agent, and a block isocyanate curing agent, and two or more types of the curing agents may be mixed and used.

The inorganic filler may include an aluminum oxide or a nitride, and the nitride may be included in an amount of 55 to 95 wt % of the inorganic filler, and more preferably, 60 to 80 wt %. When the nitride is included in this numerical range, thermal conductivity and bonding strength may be enhanced. Here, the nitride may include at least one of boron nitride and aluminum nitride. Here, the boron nitride may be a boron nitride agglomerate in which a plate-shaped boron nitride is agglomerated, and a surface of the boron nitride agglomerate may be coated with a polymer having the following Unit 1, or at least some of voids in the boron nitride aggregate may be filled by the polymer having the following Unit 1.

Unit 1 is as follows.

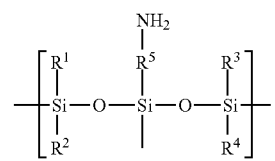

[Unit 1]

Here, one of R1, R2, R3, and R4 may be H, and the others may be selected from the group consisting of C1-C3 alkyls, C2-C3 alkenes, and C2-C3 alkynes, and R5 may be a linear, branched or cyclic divalent organic linker having 1 to 12 carbon atoms.

In one embodiment, one of the remainders among R1, R2, R3, and R4 excluding H may be selected from C2-C3 alkenes, and another and still another of the remainders may be selected from C1-C3 alkyls. For example, the polymer according to the embodiment of the present invention may include the following Unit 2.

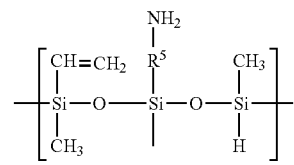

[Unit 2]

Alternatively, the remainders among R1, R2, R3, and R4, excluding H, may be selected from the group consisting of C1-C3 alkyls, C2-C3 alkenes, and C2-C3 alkynes to be different from each other.

Like the above, when the polymer according to Unit 1 or Unit 2 is coated on the boron nitride agglomerate in which the plate-shaped boron nitride is agglomerated and fills at least some of the voids in the boron nitride agglomerate, an air layer in the boron nitride agglomerate is minimized to increase thermal conductive performance of the boron nitride agglomerate, and breakage of the boron nitride aggregate may be prevented by increasing a bonding force between the plate-shaped boron nitride. Further, when a coating layer is formed on the boron nitride agglomerate in which the plate-shaped boron nitride is aggregated, forming a functional group becomes easy, and when the functional group is formed on the coating layer of the boron nitride agglomerate, affinity with the resin may increase.

In this case, a particle size (D50) of the boron nitride agglomerate may be 250 to 350 μm, and a particle size (D50) of the aluminum oxide may be 10 to 30 μm. When the particle size (D50) of the boron nitride agglomerate and the particle size (D50) of the aluminum oxide satisfy these numerical ranges, the boron nitride agglomerate and the aluminum oxide may be uniformly dispersed in the resin composition, and accordingly, it is possible to have a uniform heat conduction effect and adhesion performance throughout the resin layer. However, the present invention is not limited thereto, and at least one of the first resin layer 110 and the second resin layer 160 may be replaced with a ceramic substrate.

Referring to FIGS. 1 to 4, a wire 200 is connected to one electrode among the plurality of first electrodes 120, a wire 202 is connected to another electrode among the plurality of first electrodes 120, and power is supplied to the thermoelectric element 100 through the wires 200 and 202.

Further, a side surface of the thermoelectric element 100 is sealed by a sealing part 190. To this end, the sealing part 190 may include a sealing case 192 and a sealing material 194, and the sealing part 190 may be disposed on the first metal substrate 170 from the first metal substrate 170 to the second metal substrate 180 and may be disposed to surround the side surface of the thermoelectric element 100, for example, a side surface of the first resin layer 110, the outermost side of the plurality of first electrodes 120, the outermost side of the plurality of P-type thermoelectric legs 130 and the plurality of N-type thermoelectric legs 140, the outermost side of the plurality of second electrodes 150, and a side surface of the second resin layer 160. Accordingly, the thermoelectric element 100, that is, the first resin layer 110, the plurality of first electrodes 120, the plurality of P-type thermoelectric legs 130, the plurality of N-type thermoelectric legs 140, the plurality of second electrodes 150, and the second resin layer 160 may be sealed from external moisture, heat, and contamination.

In this case, in order to draw the wires 200 and 202 connected to the plurality of first electrodes 120 to the outside, through holes through which the wires 200 and 202 pass may be formed in the sealing case 192, and the through holes and the wires 200 and 202 should be finished through a separate sealing process. Here, the through hole refers to a path for passing through the sealing case 192 and may include not only a hole but also a groove formed in an upper end of the sealing case 192.

Here, since the wires 200 and 202 and the first metal substrate 170 are spaced apart by the thicknesses of the first resin layer 110 and the first electrode 120, the sealing material 194 should be applied even in a spaced apart space. This process is difficult to automate, and there is a problem in that the process should be manually performed.

According to the embodiment of the present invention, a connection structure between the electrodes and the wires is modified to facilitate a wire connection process and a sealing process.

Figure 5:
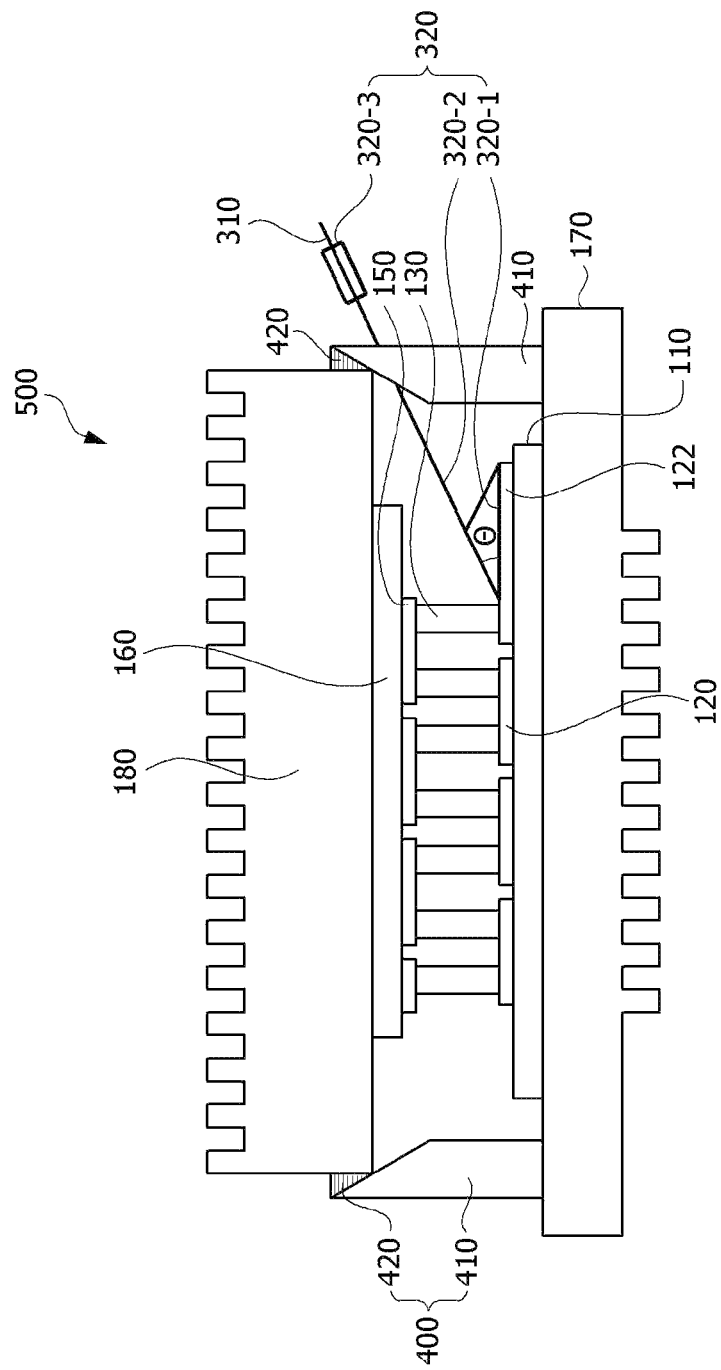
FIG. 5 is a cross-sectional view of a thermoelectric module according to one embodiment of the present invention.
Figure 6:
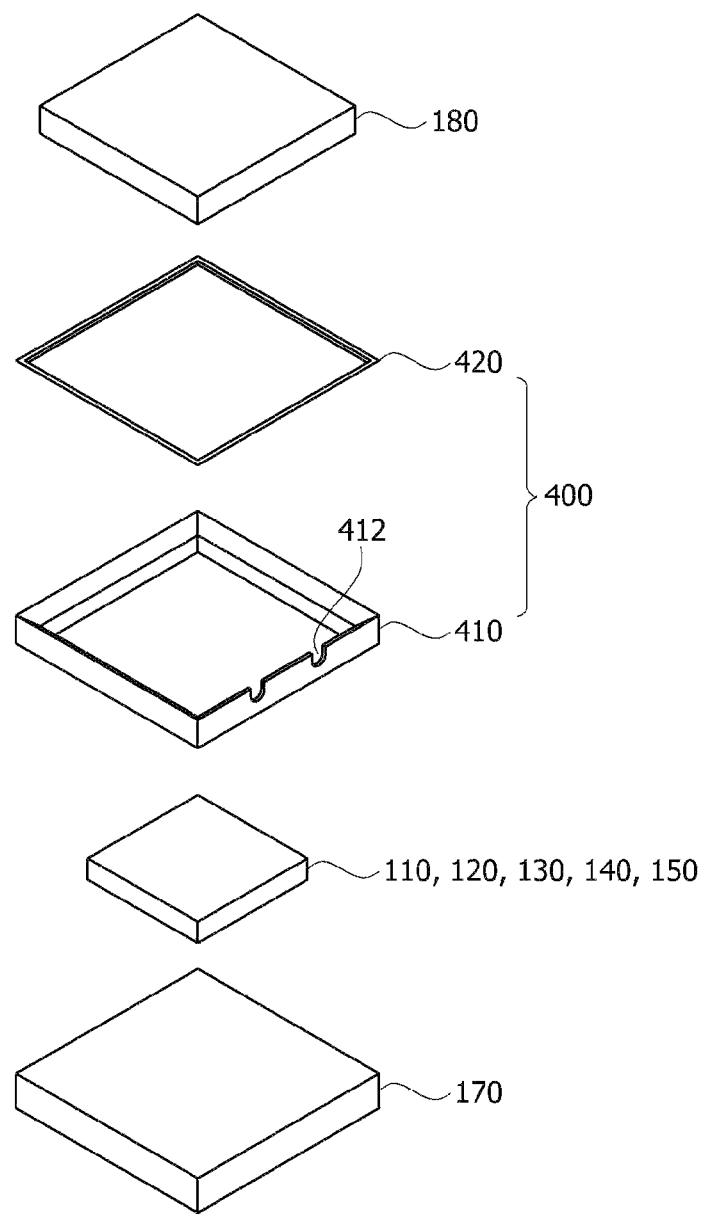
FIG. 6 is an exploded perspective view of the thermoelectric module in FIG. 5.
Figure 7:
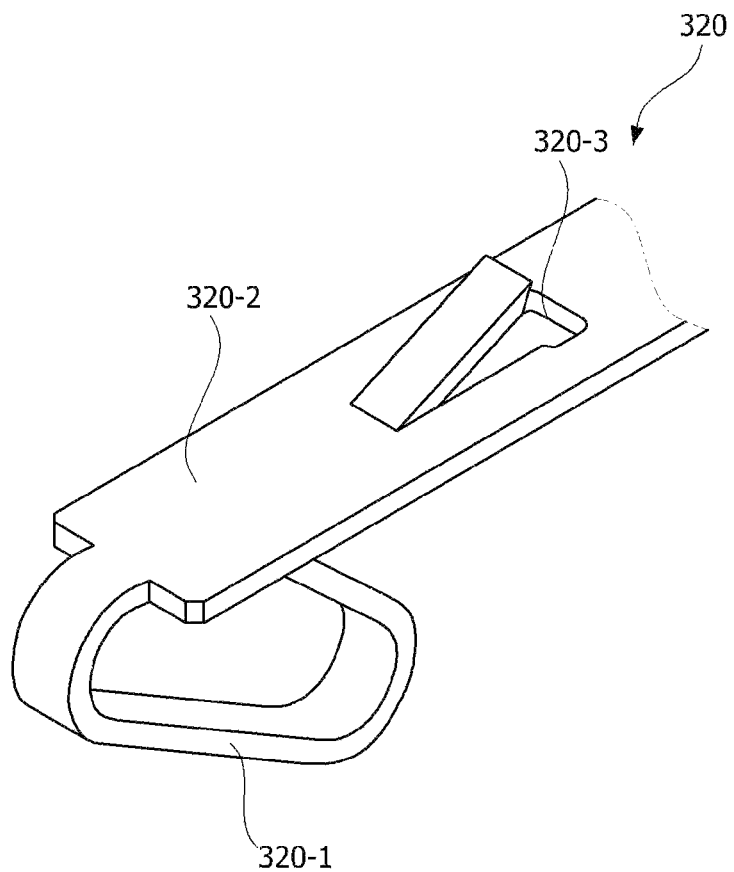
FIG. 7 illustrates one example of a connection relationship between electrodes and wires included in the thermoelectric module in FIG. 5.
Figure 8:
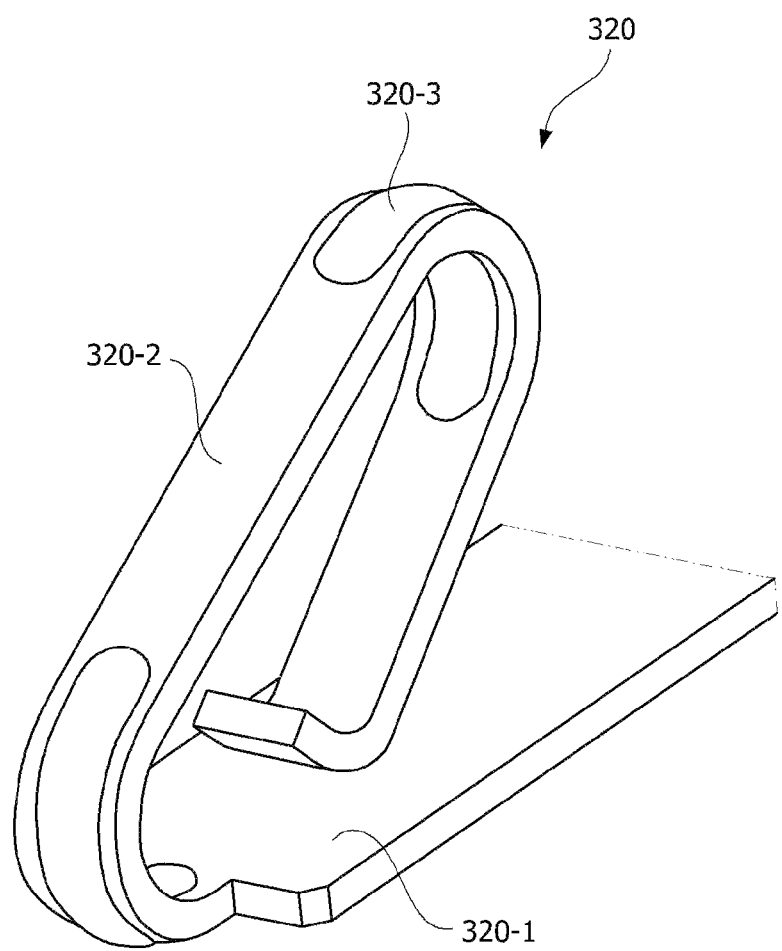
FIG. 8 illustrates another example of the connection relationship between the electrodes and the wires included in the thermoelectric module in FIG. 5.
Figure 9A:
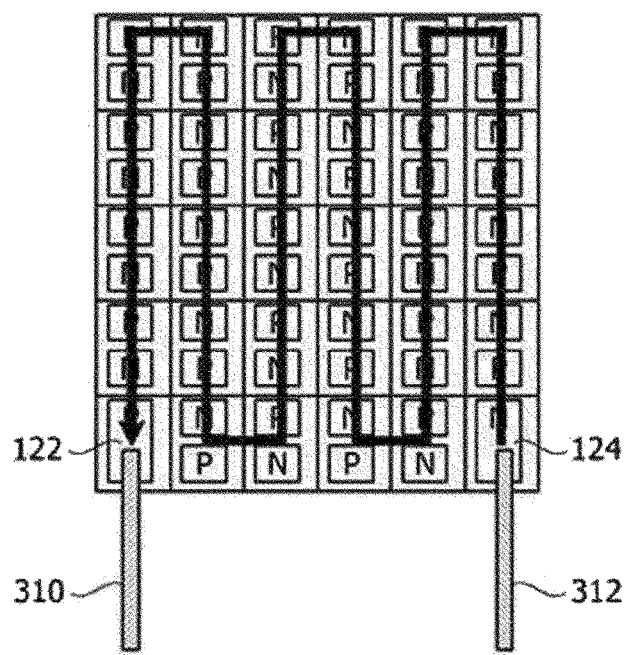
FIGS. 9A and 9B illustrate various modified examples of a wire part included in the thermoelectric module in FIG. 5.
Figure 9B:
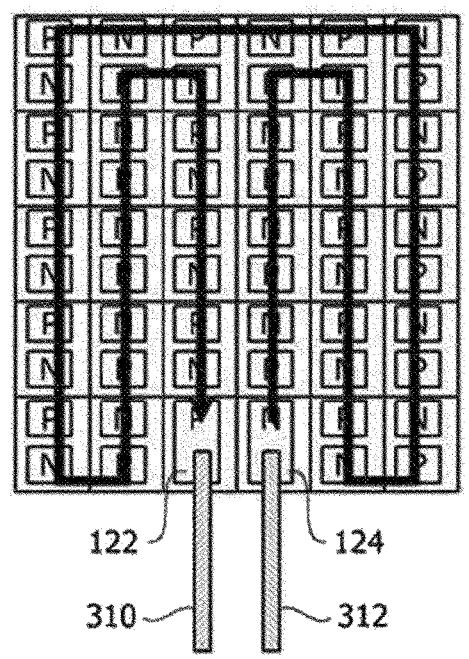
Figure 9B:
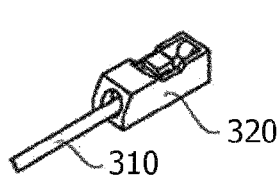
Figure 9B:
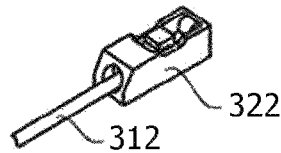
Figure 9B:
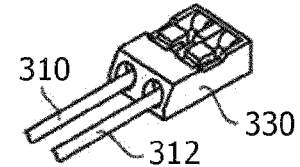
Figure 10:
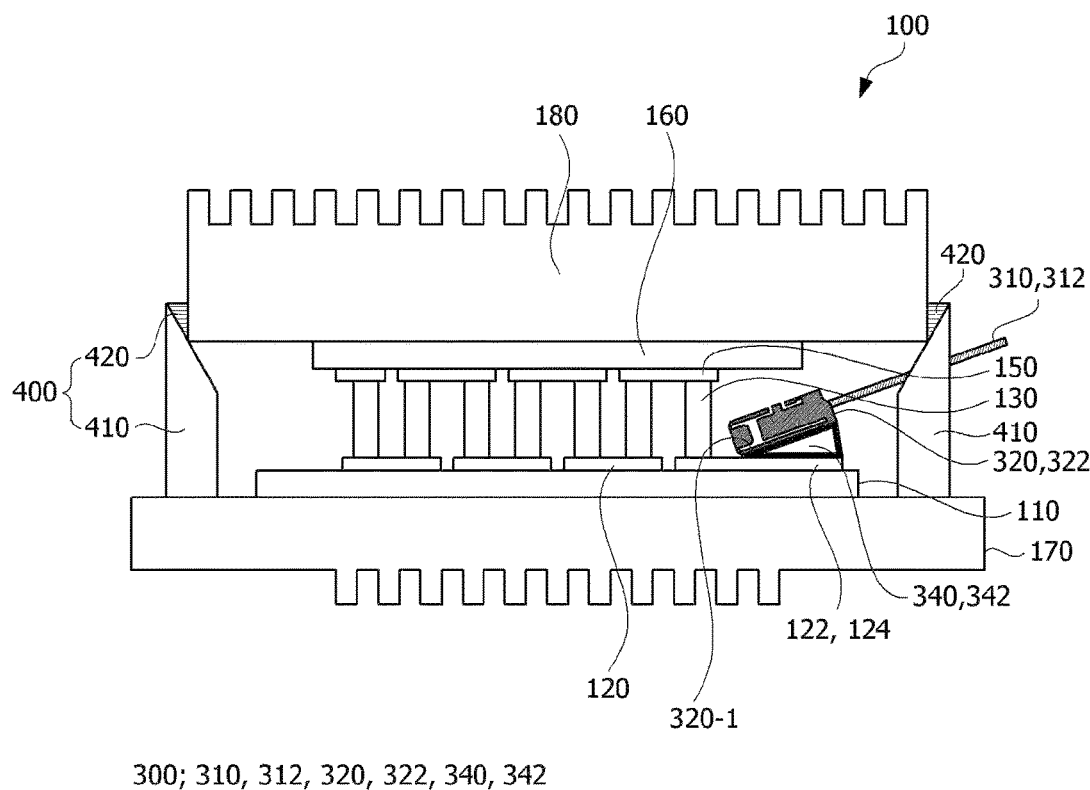
FIG. 10 is a cross-sectional view of a thermoelectric module according to another embodiment of the present invention.
Figure 11A:
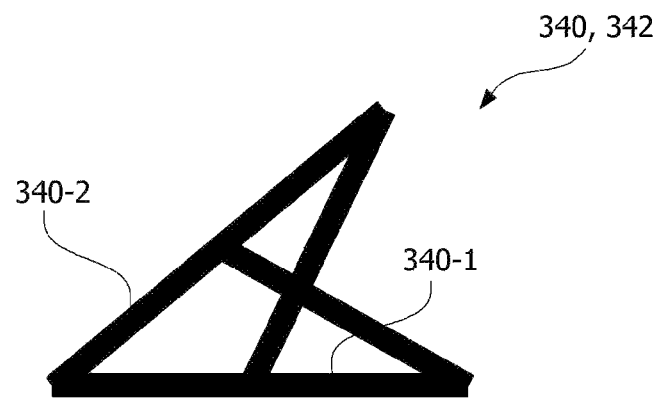
FIGS. 11A and 11B illustrate some configurations of a wire part included in the thermoelectric module in FIG. 10.
Figure 11B:
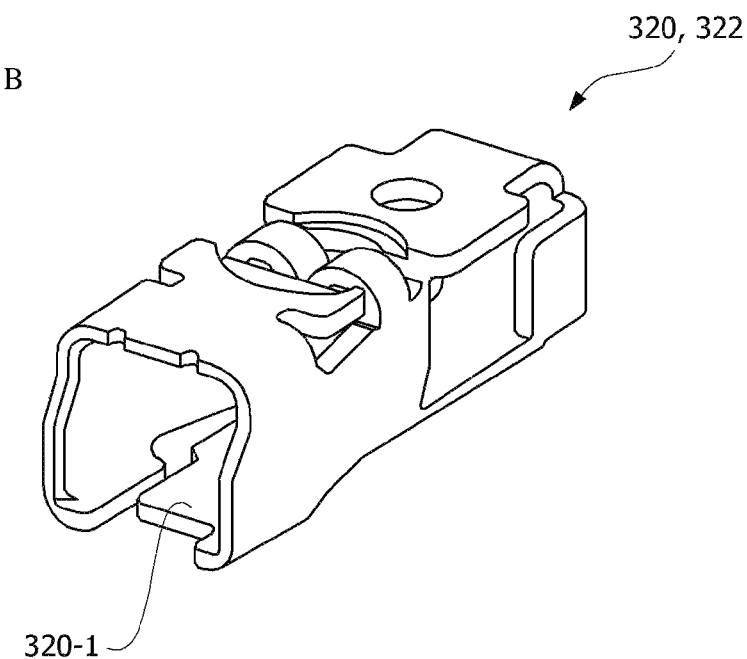
Figure 12:
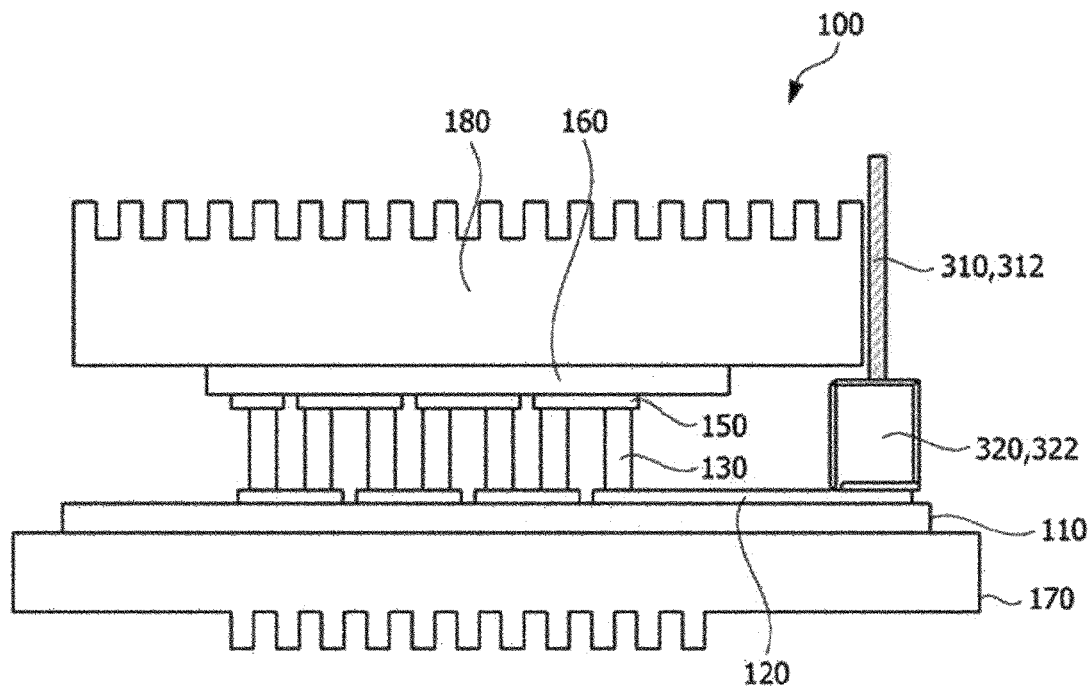
FIG. 12 is a cross-sectional view of a thermoelectric module according to still another embodiment of the present invention.
Figure 13:
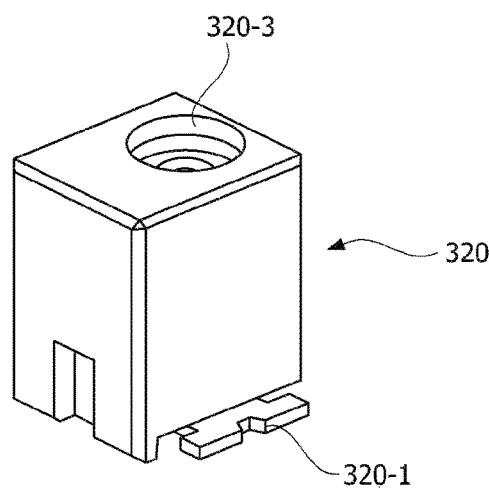
FIG. 13 illustrates some configurations of a wire part included in the thermoelectric module in FIG. 12.

FIG. 5 is a cross-sectional view of a thermoelectric module according to one embodiment of the present invention, FIG. 6 is an exploded perspective view of the thermoelectric module in FIG. 5, FIG. 7 illustrates one example of a connection relationship between electrodes and wires included in the thermoelectric module in FIG. 5, FIG. 8 illustrates another example of the connection relationship between the electrodes and the wires included in the thermoelectric module in FIG. 5, FIG. 9 illustrates various modified examples of a wire part included in the thermoelectric module in FIG. 5, FIG. 10 is a cross-sectional view of a thermoelectric module according to another embodiment of the present invention, FIG. 11 illustrates some configurations of a wire part included in the thermoelectric module in FIG. 10, FIG. 12 is a cross-sectional view of a thermoelectric module according to still another embodiment of the present invention, and FIG. 13 illustrates some configurations of a wire part included in the thermoelectric module in FIG. 12.

Referring to FIGS. 5 to 9, a thermoelectric module 500 according to one embodiment of the present invention includes a first metal substrate 170, a thermoelectric element 100 disposed on the first metal substrate 170, and a second metal substrate 180 disposed on the thermoelectric element 100, and the thermoelectric element 100 includes a first resin layer 110 disposed on the metal substrate 170, a plurality of first electrodes 120 disposed on the first resin layer 110, a plurality of P-type thermoelectric legs 130 and a plurality of N-type thermoelectric legs 140 disposed on the plurality of first electrodes 120, a plurality of second electrodes 150 disposed on the plurality of P-type thermoelectric legs 130 and the plurality of N-type thermoelectric legs 140, and a second resin layer 160 disposed on the plurality of second electrodes 150.

As for the first metal substrate 170, the thermoelectric element 100, and the second metal substrate 180, the contents described in FIGS. 1 to 4 may be applied equally, and thus an overlapping description related thereto will be omitted. Here, an area of the second metal substrate 180 may be formed smaller than an area of the first metal substrate 170.

The thermoelectric module 500 according to one embodiment of the present invention further includes a wire part 300 and a sealing part 400.

The wire part 300 includes a first wire 310 connected to one electrode 122 among the plurality of first electrodes 120 and a second wire 312 connected to another electrode 124 among the plurality of first electrodes 120. The wire part 300 is connected to the thermoelectric element 100, is drawn out through the sealing part 400, and supplies power to the thermoelectric element 100.

The sealing part 400 may be disposed on the first metal substrate 170 from the first metal substrate 170 to the second metal substrate 180 and may be disposed to surround a side surface of the thermoelectric element 100, for example, a side surface of the first resin layer 110, the outermost side of the plurality of first electrodes 120, the outermost side of the plurality of P-type thermoelectric legs 130 and the plurality of N-type thermoelectric legs 140, the outermost side of the plurality of second electrodes 150, and a side surface of the second resin layer 160. Accordingly, the thermoelectric element 100, that is, the first resin layer 110, the plurality of first electrodes 120, the plurality of P-type thermoelectric legs 130, the plurality of N-type thermoelectric legs 140, the plurality of second electrodes 150, and the second resin layer 160 may be sealed from external moisture, heat, and contamination.

The sealing part 400 may include a sealing support 410 and a sealing material 420. The sealing support 410 is disposed on one surface of the first metal substrate 170 to be spaced apart from side surfaces of the thermoelectric element 100, for example, side surfaces of the first resin layer 110, the plurality of first electrodes 120, the plurality of P-type thermoelectric legs 130 and the plurality of N-type thermoelectric legs 140, the plurality of second electrodes 150, and the second resin layer 160, and side surfaces of the second metal substrate 180, and to surround the side surfaces of the thermoelectric element 100, for example, the side surfaces of the first resin layer 110, the plurality of first electrodes 120, the plurality of P-type thermoelectric legs 130 and the plurality of N-type thermoelectric legs 140, the plurality of second electrodes 150, and the second resin layer 160, and the side surfaces of the second metal substrate 180. To this end, the sealing support 410 may have a frame shape which accommodates the first resin layer 110, the plurality of first electrodes 120, the plurality of P-type thermoelectric legs 130 and the plurality of N-type thermoelectric legs 140, the plurality of second electrodes 150, and the second resin layer 160, and at least some of the second metal substrate 180.

As shown in FIG. 6, through grooves 412, through which the wire part 300 connected to the electrodes passes, may be formed in the sealing support 410. To this end, the sealing support 410 may be an injection molded product formed of plastic or the like and may be interchanged with a sealing case or a sealing cover. Here, the sealing support 410 is illustrated as having a quadrangular shape but is not limited thereto, and the sealing support 410 may be variously modified to a polygonal shape, a circular shape, and the like.

Further, the sealing material 420 may be disposed between the first metal substrate 170 and the sealing support 410 and between the second metal substrate 180 and the sealing support 410 and may serve to form an airtight seal between the first metal substrate 170 and the sealing support 410 and between the second metal substrate 180 and the sealing support 410. The sealing material 420 may include at least one of an epoxy resin and a silicone resin and may be interchanged with a finishing material, a finishing layer, a waterproofing material, a waterproofing layer, and the like.

Meanwhile, according to the embodiment of the present invention, at least a partial region of the wire part 300 may be disposed to form an angle θ of 10 to 90°, and preferably, 30 to 70° with respect to the first electrode 120. Here, the wire part 300 may include a first region connected to the first electrode 120 and disposed at an inner side of the sealing part 400, a second region disposed at an outer side of the sealing part 400, and a third region disposed between the first region and the second region, and at least the partial region of the wire part 300 may be a region included in the third region. Here, the third region may include a region where the wire passes through a through hole formed in the sealing part 400, specifically, the sealing support 410.

Alternatively, at least some regions of the first wire 310 and the second wire 312 may be disposed to form angles θ of 10 to 90° with respect to one electrode 122 and the other electrode 124. Accordingly, the through grooves 412 of the sealing case 410 may be disposed closer to the second metal substrate 180 than to the first metal substrate 170. Accordingly, since a gap between the first wire 310 and the second wire 312, and the sealing case 410 and the first metal substrate 170 increase, a process of applying the sealing material 420 may be facilitated. In the present specification, the angle θ with respect to the electrode may refer to an angle with respect to an upper surface of the electrode, and the upper surface of the electrode may refer to a surface opposite to a surface which comes into contact with the resin layer, between both surfaces of the electrode.

In this case, as shown in FIG. 9A, the wire part 300 may further include a first connector 320 which connects one electrode 122 and the first wire 310 and a second connector 322 which connects another electrode 124 and the second wire 312.

At least one of the first connector 320 and the second connector 322, for example, the first connector 320, may include an electrode connection region 320-1 which comes into contact with one electrode 122 and has electrical conductivity, an inclined region 320-2 forming a predetermined angle, for example, 10 to 90° with one electrode, and a wire fastening region 320-3 to which the first wire 310 is fastened, and which may be electrically connected to the electrode 122 through the electrode connection region 320-1. Accordingly, the first wire 310 may be disposed to have an inclination of 10 to 90° from the electrode 122, and thus, the sealing process and the wire connection process may be easily performed, and the wire may be replaced.

A structure of the first connector 320 is not limited to the designs shown in FIGS. 7 and 8 when including the electrode connection region 320-1, the inclined region 320-2, and the wire fastening region 320-3, and may be modified to various designs.

For convenience of description, in FIGS. 5, 7, and 8, only the first connector 320 will be described as an example, but the same structure may also be applied to the second connector 322.

Meanwhile, FIG. 9A illustrates that the wire part 300 includes the first connector 320 and the second connector 322, but the present invention is not limited thereto. As shown in FIG. 9B, the wire part 300 may include only one connector 330. For example, one connector 330 may connect one electrode 122 and the first wire 310 and may connect another electrode 124 and the second wire 312 when one electrode 122 to which the first wire 310 is connected and another electrode 124 to which the second wire 312 is connected are disposed adjacent to each other using a connection relationship between the plurality of first electrodes 120, the plurality of P-type thermoelectric legs 130 and the plurality of N-type thermoelectric legs 140, and the plurality of second electrodes 150. Accordingly, the wires drawn to the outside of the thermoelectric module 500 may be easy to process and organize.

Meanwhile, referring to FIGS. 10 and 11, the wire part 300 may further include a first support 340 disposed between one electrode 122 and the first connector 320, and a second support 342 disposed between another electrode 124 and the second connector 322. Here, except for the first support 340 and the second support 342, since the contents are the same as those described in FIGS. 1 to 9, descriptions of overlapping contents will be omitted.

According to the embodiment of the present invention, at least one of the angle formed by the first wire 310 and one electrode 122 and the angle formed by the second wire 312 and another electrode 124 may be changed by at least one of the first support 340 and the second support 342. In this case, at least one of the first support 340 and the second support 342 has electrical conductivity and may come into contact with at least one of one electrode 122 and another electrode 124.

For example, at least one of the first support 340 and the second support 342 may include a first surface 340-1 which comes into direct contact with at least one of one electrode 122 and another electrode 124 and a second surface 340-2 which is inclined with the first surface 340-1 at a predetermined angle and which comes into direct contact with at least one of the first connector 320 and the second connector 322. Further, at least one of the first connector 320 and the second connector 322 may include a surface 320-1 having electrical conductivity, and the surface 320-1 having electrical conductivity may come into contact with at least one of the first support 340 and the second support 342. Accordingly, the surface 320-1 having electrical conductivity may be an electrode connection region which is indirectly connected to the electrodes. Accordingly, the first wire 310 may be disposed to have an inclination of 10 to 90° with the electrode 122, and thus, the sealing process and the wire connection process may be easily performed, and the wire can be replaced.

Next, referring to FIGS. 12 and 13, at least one of the first wire 310 and the second wire 312 may also be connected to at least one of the first connector 320 and the second connector 322 in a direction toward the first metal substrate 170 from the second metal substrate 180, for example, in a direction forming an angle of approximately 90° with respect to the first electrode 120. Here, the angle of approximately 90° may be in a range of 90°±10°, preferably, 90°±5°, more preferably, 90°±3°, and even more preferably, 90°±1°. Here, except for the first support 340 and the second support 342, since the contents are the same as those described in FIGS. 1 to 8, descriptions of overlapping contents will be omitted, and the structure of the sealing part 400 may be modified according to the structure and position of the wire part 300.

Hereinafter, with reference to FIG. 14, an example in which the thermoelectric module according to the embodiment of the present invention is applied to a water purifier will be described.

Figure 14:
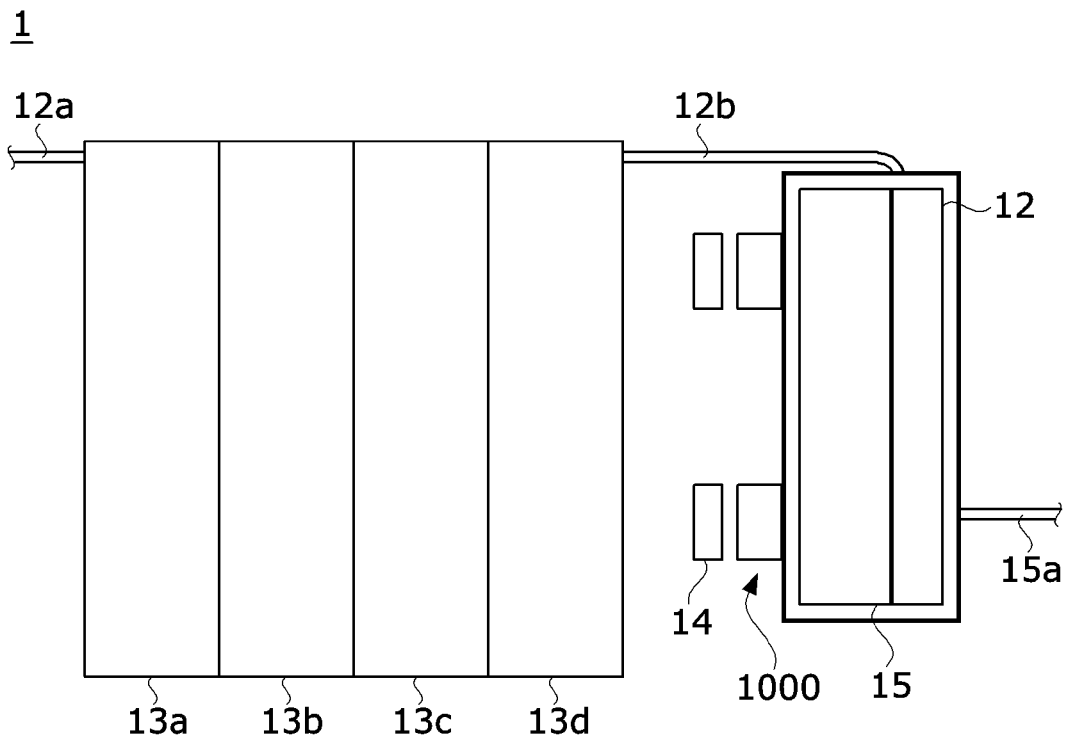
FIG. 14 is a block diagram of a water purifier to which the thermoelectric module according to the embodiment of the present invention is applied.

FIG. 14 is a block diagram of a water purifier to which the thermoelectric module according to the embodiment of the present invention is applied.

A water purifier 1 to which the thermoelectric module according to the embodiment of the present invention is applied includes a raw water supply pipe 12a, a purified water tank inlet pipe 12b, a purified water tank 12, a filter assembly 13, a cooling fan 14, a heat storage tank 15, a cold water supply pipe 15a, and a thermoelectric module 1000.

The raw water supply pipe 12a is a supply pipe which introduces water to be purified into the filter assembly 13 from a water source, the purified water tank inlet pipe 12b is an inlet pipe which introduces the water purified by the filter assembly 13 into the purified water tank 12, and the cold water supply pipe 15a is a supply pipe through which cold water cooled to a predetermined temperature by the thermoelectric module 1000 in the purified water tank 12 is finally supplied to a user.

The purified water tank 12 temporarily accommodates the purified water to store the water purified through the filter assembly 13 and introduced through the purified water tank inlet pipe 12b and supply the water to the outside.

The filter assembly 13 is composed of a precipitation filter 13a, a pre-carbon filter 13b, a membrane filter 13c, and a post-carbon filter 13d.

That is, the water introduced into the raw water supply pipe 12a may be purified through the filter assembly 13.

The heat storage tank 15 is disposed between the purified water tank 12 and the thermoelectric module 1000 to store cold air generated in the thermoelectric module 1000. The cold air stored in the heat storage tank 15 is applied to the purified water tank 12 to cool the water accommodated in the purified water tank 120.

The heat storage tank 15 may come into surface contact with the purified water tank 12 so that the cold air may be smoothly transferred.

As described above, the thermoelectric module 1000 includes a heat absorbing surface and a heating surface and has one side which is cooled and the other side which is heated by the movement of electrons on a P-type semiconductor and an N-type semiconductor.

Here, the one side may be the purified water tank 12 side and the other side may be an opposite side of the purified water tank 12.

Further, as described above, the thermoelectric module 1000 has excellent waterproofing and dustproofing performance and improved heat flow performance and thus may efficiently cool the purified water tank 12 in the water purifier.

Hereinafter, with reference to FIG. 15, an example in which the thermoelectric module according to the embodiment of the present invention is applied to a refrigerator will be described.

Figure 15:
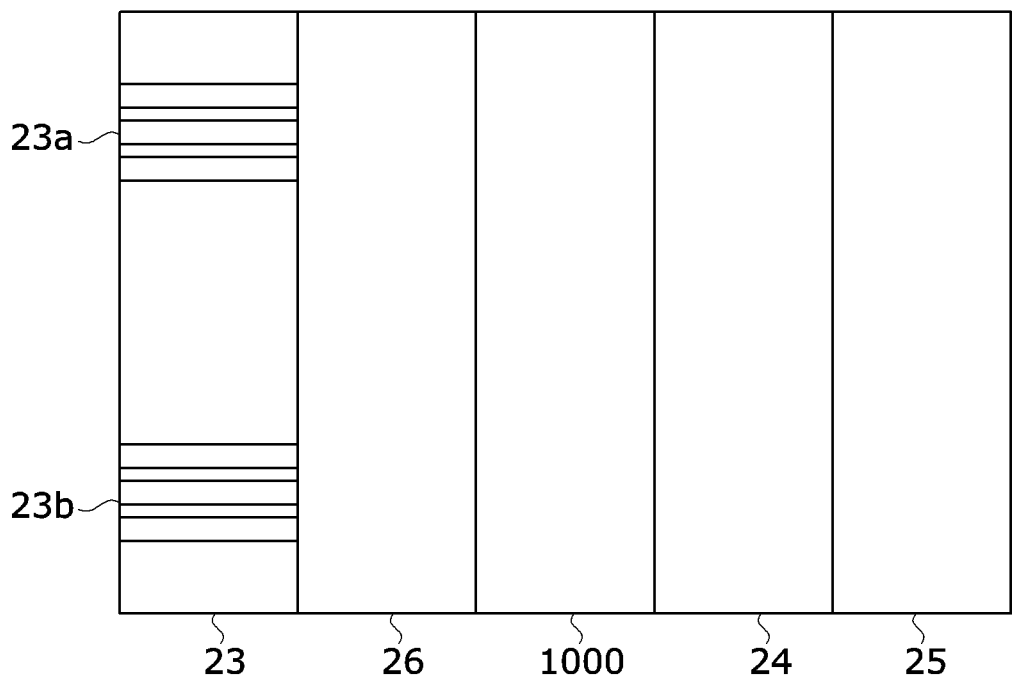
FIG. 15 is a block diagram of a refrigerator to which the thermoelectric module according to the embodiment of the present invention is applied.

FIG. 15 is a block diagram of a refrigerator to which the thermoelectric module according to the embodiment of the present invention is applied.

The refrigerator includes a deep temperature evaporation chamber cover 23, an evaporation chamber partition wall 24, a main evaporator 25, a cooling fan 26, and a thermoelectric module 1000 in a deep temperature evaporation chamber.

The inside of the refrigerator is partitioned into a deep temperature storage chamber and the deep temperature evaporation chamber by the deep temperature evaporation chamber cover 23.

Specifically, an inner space corresponding to the front of the deep temperature evaporation chamber cover 23 may be defined as the deep temperature storage chamber, and an inner space corresponding to the rear of the deep temperature evaporation chamber cover 23 may be defined as the deep temperature evaporation chamber.

A discharge grill 23a and a suction grill 23b may be formed on a front surface of the deep temperature evaporation chamber cover 23.

The evaporation chamber partition wall 24 is installed at a point spaced frontward from a rear wall of an inner cabinet and partitions a space in which the deep temperature storage system is located and a space in which the main evaporator 25 is located.

The cold air cooled by the main evaporator 25 is supplied to a freezing chamber and then returns to the main evaporator side.

The thermoelectric module 1000 is accommodated in the deep temperature evaporation chamber and has a structure in which the heat absorbing surface faces a drawer assembly of the deep temperature storage chamber, and the heating surface faces the evaporator. Accordingly, a heat absorbing phenomenon generated by the thermoelectric module 1000 may be used to quickly cool food stored in the drawer assembly to a super low temperature state of minus 50° C. or less.

Further, as described above, the thermoelectric module 1000 has excellent waterproofing and dustproofing performance and improved heat flow performance and thus may efficiently cool the drawer assembly in the refrigerator.

The thermoelectric element according to the embodiment of the present invention may be applied to a power generation device, a cooling device, a heating device, and the like. Specifically, the thermoelectric element according to the embodiment of the present invention may be mainly applied to an optical communication module, a sensor, a medical device, a measuring device, the aerospace industry, a refrigerator, a chiller, an automobile ventilation sheet, a cup holder, a washing machine, a dryer, a wine cellar, a water purifier, a power supply device for a sensor, a thermopile, and the like. Alternatively, the thermoelectric element according to the embodiment of the present invention may be applied to a power generation device which generates electricity using waste heat generated from an engine of a vehicle, a ship, or the like.

Here, as an example in which the thermoelectric element according to the embodiment of the present invention is applied to a medical device, there is a polymerase chain reaction (PCR) device. The PCR device is a device for amplifying deoxyribonucleic acid (DNA) to determine a nucleotide sequence of DNA and demands precise temperature control and requires a thermal cycle. To this end, a Peltier-based thermoelectric element may be applied.

As another example in which the thermoelectric element according to the embodiment of the present invention is applied to the medical device, there is a photodetector. Here, the photodetector includes an infrared/ultraviolet ray detector, a charge coupled device (CCD) sensor, an X-ray detector, a thermoelectric thermal reference source (TTRS), and the like. The Peltier-based thermoelectric element may be applied to cool the photodetector. Accordingly, it is possible to prevent a wavelength change, an output decrease, a resolution decrease, or the like due to a temperature increase in the photodetector.

As still another example in which the thermoelectric element according to the embodiment of the present invention is applied to the medical device, there is an immunoassay field, an in vitro diagnostics field, a general temperature control and cooling system, a physical therapy field, a liquid chiller system, a blood/plasma temperature control field, or the like. Accordingly, precise temperature control is possible.

As yet another example in which the thermoelectric element according to the embodiment of the present invention is applied to the medical device, there is an artificial heart. Accordingly, power may be supplied to the artificial heart.

As an example in which the thermoelectric element according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain a temperature of an image sensor.

As another example in which the thermoelectric element according to the embodiment of the present invention is applied to the aerospace industry, there is a cooling device, a heater, a power generation device, or the like.

In addition, the thermoelectric element according to the embodiment of the present invention may be applied to other industrial fields for power generation, cooling, and heating.

Although preferable embodiments of the present invention are described above, those skilled in the art may variously modify and change the present invention within the scope of the spirit and area of the present invention disclosed in the claims which will be described below.

The invention claimed is:

1. A thermoelectric module comprising:
   a first substrate;
   a thermoelectric element disposed on the first substrate;
   a second substrate disposed on the thermoelectric element and having a smaller area than the first substrate;
   a sealing part disposed on the first substrate and surrounding a side surface of the thermoelectric element; and
   a wire part connected to the thermoelectric element, drawn out through the sealing part, and supplying power to the thermoelectric element,
   wherein the sealing part has a through hole through which the wire part passes, and the through hole is disposed closer to the second substrate than the first substrate,
   wherein the thermoelectric element includes a first resin layer disposed on the first substrate, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second resin layer disposed on the plurality of second electrodes,
   the wire part includes a first wire connected to one electrode among the plurality of first electrodes and a second wire connected to another electrode among the plurality of first electrodes,
   the wire part further includes a first connector configured to connect the one electrode and the first wire and a second connector configured to connect the other electrode and the second wire, and
   wherein at least one of the first connector and the second connector includes an electrode connection region in contact with at least one of the one electrode and the other electrode and having electrical conductivity, an inclined region forming a predetermined inclination angle with the at least one of the one electrode and the other electrode, and a wire fastening region to which at least one of the first wire and the second wire is fastened.

2. The thermoelectric module of claim 1, wherein:
   the wire part further includes a first support disposed between the one electrode and the first connector and a second support disposed between the other electrode and the second connector; and
   at least one of an angle formed by the first wire and the one electrode and an angle formed by the second wire and the other electrode is changed by at least one of the first support and the second support.

3. The thermoelectric module of claim 2, wherein:
   the at least one of the first support and the second support has electrical conductivity and comes into contact with at least one of the one electrode and the other electrode;
   at least one of the first connector and the second connector includes a surface having electrical conductivity; and
   the surface having electrical conductivity comes into contact with the at least one of the first support and the second support.

4. The thermoelectric module of claim 1, wherein at least one of the first wire and the second wire is connected to at least one of the first connector and the second connector in a direction from the second substrate to the first substrate.

5. The thermoelectric module of claim 1, wherein:
   the one electrode and the other electrode are disposed adjacent to each other; and
   the thermoelectric module further comprises a connector configured to connect the one electrode and the first wire and connect the other electrode and the second wire.

6. The thermoelectric module of claim 1, wherein at least a partial region of the wire part is disposed to form an angle of 10 to 90° with respect to the first substrate.

7. The thermoelectric module of claim 6, wherein:
the wire part includes a first region disposed at an inner side of the sealing part, a second region disposed at an outer side of the sealing part, and a third region disposed between the first region and the second region; and
the at least partial region of the wire part is included in the third region.

8. The thermoelectric module of claim 7, wherein the third region is a region which pass the through hole.

9. The thermoelectric module of claim 6, wherein the at least partial region of the wire part is disposed to form an angle of 30 to 70° with respect to the first substrate.

10. The thermoelectric module of claim 6, wherein:
the thermoelectric element includes a first electrode layer, a semiconductor structure layer disposed on the first electrode layer, and a second electrode layer disposed on the semiconductor structure layer, and
the wire part is connected to the first electrode layer.

11. The thermoelectric module of claim 10, wherein the wire part includes a connector disposed on the first electrode layer, and a wire connected to the first electrode layer through the connector.

12. The thermoelectric module of claim 11, wherein the connector is disposed at an inner side of the sealing part, and the wire is drawn out of the sealing part through the through hole.

13. The thermoelectric module of claim 12, wherein the connector includes an electrode connection region coming into contact with the first electrode layer and having electrical conductivity, an inclined region forming a predetermined inclination angle with the first electrode layer and a wire fastening region to which the wire is fastened.

14. The thermoelectric module of claim 12, wherein:
the wire part further includes a support disposed between the first electrode layer and the connector; and
the support includes a first surface coming into contact with the first electrode layer and a second surface forming a predetermined inclination angle with the first surface and coming into contact with the connector.

15. The thermoelectric module of claim 1, wherein:
the sealing part includes a sealing case surrounding the side surface of the thermoelectric element, and a sealing material disposed between the first substrate and the sealing case and between the second substrate and the sealing case; and
the through hole is formed on the sealing case.

16. The thermoelectric module of claim 1, wherein:
the first substrate is a metal substrate; and
the thermoelectric element includes a resin layer disposed on the first substrate, a first electrode layer disposed on the resin layer, a semiconductor structure layer disposed on the first electrode layer, and a second electrode layer disposed on the semiconductor structure layer.

17. A heating-cooling device comprising the thermoelectric module of claim 1.

18. A power generation device comprising the thermoelectric module of claim 1.

* * * * *